US012658730B2

(12) United States Patent
Cha et al.

(10) Patent No.: US 12,658,730 B2
(45) Date of Patent: Jun. 16, 2026

(54) BATTERY MANAGEMENT APPARATUS AND METHOD

(71) Applicant: LG Energy Solution, Ltd., Seoul (KR)

(72) Inventors: A-Ming Cha, Daejeon (KR); Yoon-Jung Bae, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 811 days.

(21) Appl. No.: 17/928,085

(22) PCT Filed: Oct. 6, 2021

(86) PCT No.: PCT/KR2021/013729
§ 371 (c)(1),
(2) Date: Nov. 28, 2022

(87) PCT Pub. No.: WO2022/085996
PCT Pub. Date: Apr. 28, 2022

(65) Prior Publication Data
US 2023/0275449 A1 Aug. 31, 2023

(30) Foreign Application Priority Data
Oct. 23, 2020 (KR) ........................ 10-2020-0138622

(51) Int. Cl.
*H02J 7/00* (2026.01)
*G01R 31/367* (2019.01)
(Continued)

(52) U.S. Cl.
CPC ........... *H02J 7/971* (2026.01); *G01R 31/367* (2019.01); *G01R 31/382* (2019.01); *H01M 10/44* (2013.01);
(Continued)

(58) Field of Classification Search
CPC .............. H02J 7/007188; H02J 7/0048; G01R 31/367; G01R 31/382; H01M 10/44; H01M 10/46
(Continued)

(56) References Cited

U.S. PATENT DOCUMENTS 5,963,010 A 10/1999 Hayashi et al.
9,935,477 B2 * 4/2018 Araki .................... H01M 10/48
(Continued)

FOREIGN PATENT DOCUMENTS

CN 110208716 A 9/2019
CN 110869784 A 3/2020
(Continued)

OTHER PUBLICATIONS

International Search Report for PCT/KR2021/013729 mailed Jan. 24, 2022. 3 pgs.
(Continued)

*Primary Examiner* — Nathaniel R Pelton
(74) *Attorney, Agent, or Firm* — Lerner David LLP

(57) ABSTRACT

A battery management apparatus includes a profile generating unit configured to obtain a battery profile representing a correspondence between voltage and SOC of a battery and generate a differential profile representing a correspondence between the SOC and a differential voltage of the SOC based on the obtained battery profile, and a control unit configured to receive the differential profile from the profile generating unit, calculate a degree of association between the differential profile and a preset criterion profile, and judge a type of a negative electrode of the battery based on the calculated degree of association.

12 Claims, 5 Drawing Sheets

(51) Int. Cl.

| | |
|---|---|
| *G01R 31/382* | (2019.01) |
| *H01M 10/44* | (2006.01) |
| *H01M 10/46* | (2006.01) |
| *H02J 7/82* | (2026.01) |
| *H02J 7/90* | (2026.01) |
| *H01M 10/42* | (2006.01) |

(52) U.S. Cl.
CPC ............... *H01M 10/46* (2013.01); *H02J 7/82* (2026.01); *H01M 2010/4271* (2013.01)

(58) Field of Classification Search
USPC ........................................................ 320/137
See application file for complete search history.

(56) References Cited

U.S. PATENT DOCUMENTS

| | | | |
|---|---|---|---|
| 2013/0335030 A1 | 12/2013 | Joe et al. | |
| 2013/0337301 A1* | 12/2013 | Joe | H01M 10/48 |
| | | | 429/90 |
| 2013/0346000 A1 | 12/2013 | Joe et al. | |
| 2015/0086812 A1 | 3/2015 | Joe et al. | |
| 2015/0260798 A1 | 9/2015 | Sugiyama et al. | |
| 2016/0103185 A1 | 4/2016 | Chang et al. | |
| 2016/0181833 A1 | 6/2016 | Araki et al. | |
| 2016/0254687 A1* | 9/2016 | Tanaka | H01M 10/425 |
| | | | 320/112 |
| 2019/0202299 A1 | 7/2019 | Oh et al. | |

| | | | |
|---|---|---|---|
| 2020/0150183 A1 | 5/2020 | Yoon et al. | |
| 2020/0271727 A1 | 8/2020 | Bae et al. | |
| 2021/0041506 A1 | 2/2021 | Bae et al. | |
| 2021/0046844 A1 | 2/2021 | Bae et al. | |
| 2021/0053450 A1 | 2/2021 | Oh et al. | |

FOREIGN PATENT DOCUMENTS

| | | | |
|---|---|---|---|
| CN | 111194412 A | 5/2020 | |
| EP | 3674731 A1 | 7/2020 | |
| JP | H10136574 A | 5/1998 | |
| JP | H10275615 A | 10/1998 | |
| JP | 2009176533 A | 8/2009 | |
| JP | 2013196805 A | 9/2013 | |
| JP | 2015175753 A | 10/2015 | |
| JP | 201681691 A | 5/2016 | |
| JP | 6021087 B2 | 11/2016 | |
| JP | 6118906 B2 | 4/2017 | |
| JP | 6295858 B2 | 3/2018 | |
| KR | 20190081237 A | 7/2019 | |
| KR | 20190118529 A | 10/2019 | |
| KR | 20190118536 A | 10/2019 | |
| WO | 2015025402 A1 | 2/2015 | |
| WO | 2015080285 A1 | 6/2015 | |

OTHER PUBLICATIONS

Extended European Search Report including Written Opinion for Application No. EP 21883068.5, dated Oct. 1, 2024, 8 pages.

* cited by examiner

BATTERY MANAGEMENT APPARATUS AND METHOD

CROSS-REFERENCE TO RELATED APPLICATIONS

The present application is a national phase entry under 35 U.S.C. § 371 of International Application No. PCT/KR2021/013729 filed Oct. 6, 2021, which claims priority to Korean Patent Application No. 10-2020-0138622 filed on Oct. 23, 2020, the disclosures of which are incorporated herein by reference.

TECHNICAL FIELD

The present disclosure relates to a battery management apparatus and method, and more particularly, to a battery management apparatus and method capable of judging the type of a negative electrode of a battery.

BACKGROUND ART

Recently, the demand for portable electronic products such as notebook computers, video cameras and portable telephones has increased sharply, and electric vehicles, energy storage batteries, robots, satellites and the like have been developed in earnest. Accordingly, high-performance batteries allowing repeated charging and discharging are being actively studied.

Batteries commercially available at present include nickel-cadmium batteries, nickel hydrogen batteries, nickel-zinc batteries, lithium batteries and the like. Among them, the lithium batteries are in the limelight since they have almost no memory effect compared to nickel-based batteries and also have very low self-charging rate and high energy density.

The battery shows a voltage profile representing a correspondence between voltage and capacity differently depending on the types of a positive electrode and a negative electrode used. If the types of the positive electrode and the negative electrode of the battery are not known, there is a problem that the usage condition of the battery cannot be specifically set. For example, when the types of the positive electrode and the negative electrode of the battery are unknown, there is a problem that a battery, which is not suitable for rapid charging, is provided in a product requiring rapid charging, so that the battery is degraded rapidly as being is used. That is, judging the types of a positive electrode and a negative electrode for a battery whose positive and negative electrodes are unknown is one of the ways to prevent rapid degradation of the battery.

However, the positive electrode of the battery may be distinguished relatively easily depending on the composition of nickel (Ni), but it is difficult to judge whether the negative electrode of the battery is a natural graphite-based negative electrode or an artificial graphite-based negative electrode.

Therefore, it is necessary to judge the type of the negative electrode of the battery based on the battery voltage and SOC (State of Charge) behavior and to set the usage condition for the battery according to the judgment result.

SUMMARY

Technical Problem

The present disclosure is designed to solve the problems of the related art, and therefore the present disclosure is directed to providing a battery management apparatus and method for judging a type of a negative electrode of a battery based on voltage and SOC of the battery and setting a usage condition for the battery according to the judgment result.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

A battery management apparatus according to one aspect of the present disclosure may comprise: a controller; and memory having instructions that, when executed, are configured to cause the controller to: receive a differential profile representing a correspondence between a state of charge (SOC) of a battery and a differential voltage of the SOC; calculate a degree of association between the differential profile and one or more preset profiles; and determine a type of a negative electrode of the battery based on the calculated degree of association.

The one or more preset profiles may include a first preset profile and a second preset profile different from the first preset profile, and the instructions may be configured to cause the controller to calculate a first degree of association between the differential profile and the first preset profile; calculate a second degree of association between the differential profile and the second preset profile; compare the first degree of association to the second degree of association; and determine the type of the negative electrode of the battery based on the comparison.

The instructions may be configured to cause the controller to determine that the negative electrode of the battery is a natural graphite-based negative electrode in response to the first degree of association being equal to or greater than the second degree of association.

The instructions may be configured to cause the controller to determine that the negative electrode of the battery is an artificial graphite-based negative electrode in response to the first degree of association being less than the second degree of association The first preset profile may represent a correspondence between the SOC and the differential voltage of a first reference cell including the natural graphite-based negative electrode.

The second preset profile may represent a correspondence between the SOC and the differential voltage of a second reference cell including the artificial graphite-based negative electrode.

The first degree of association may represent a profile concordance rate between a first SOC region of the first preset profile and the first SOC region of the differential profile; and the second degree of association may represent a profile concordance rate between the first SOC region of the second preset profile and the first SOC region of the differential profile.

The instructions may be configured to cause the controller to determine a target peak in a second SOC region of the differential profile, compare a differential voltage of the determined target peak with a preset reference value, and determine whether to determine the type of the negative electrode of the battery based on the comparison between the differential voltage of the determined target peak and the preset reference value.

The instructions may be configured to cause the controller to determine the type of the negative electrode of the battery based on the first preset profile, the second preset profile and the differential profile in response to the differential voltage of the target peak being equal to or greater than the reference value.

The instructions may be configured to cause the controller to set a usage condition for the battery, based on the determined type of the negative electrode of the battery.

The instructions may be configured to cause the controller to set the usage condition for the battery so that the battery is charged and discharged at less than a predetermined current rate (C-rate) in response to the negative electrode of the battery being determined as a natural graphite-based negative electrode.

The instructions may be configured to cause the controller to set the usage condition for the battery so that the battery is charged and discharged at the predetermined C-rate or above in response to the negative electrode of the battery being determined as an artificial graphite-based negative electrode.

The instructions may be configured to cause the controller to reduce an available SOC region for the battery and set the usage condition for the battery so that the battery is charged and discharged at less than the predetermined C-rate in response to the type of the negative electrode of the battery being undetermined.

A battery inspection device according to another aspect of the present disclosure may comprise the battery management apparatus according to any of the aspects of the present disclosure described herein.

A battery pack according to still another aspect of the present disclosure may comprise the battery and the battery management apparatus according to any of the aspects of the present disclosure described herein.

A battery management method according to still another aspect of the present disclosure may comprise: receiving, by a controller, a differential profile representing a correspondence between a state of charge (SOC) of a battery and a differential voltage of the SOC; calculating, by the controller, a degree of association between the differential profile and one or more preset profiles; and determine, by the controller, a type of a negative electrode of the battery based on the degree of association.

A battery management method according to still another aspect of the present disclosure may further comprise, determining, by the controller, a target peak in an SOC region of the differential profile; and comparing, by the controller, a differential voltage of the determined target peak with a preset reference value, wherein calculating the degree of association and determining the type of the negative electrode of the battery are performed in response to the differential voltage of the target peak being equal to or greater than the reference value.

Advantageous Effects

According to one aspect of the present disclosure, there is an advantage that the type of the negative electrode of the battery may be judged even if there is no prior information about the battery.

The effects of the present disclosure are not limited to the effects mentioned above, and other effects not mentioned will be clearly understood by those skilled in the art from the description of the claims.

BRIEF DESCRIPTION OF THE DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

DETAILED DESCRIPTION

It should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Additionally, in describing the present disclosure, when it is deemed that a detailed description of relevant known elements or functions renders the key subject matter of the present disclosure ambiguous, the detailed description is omitted herein.

The terms including the ordinal number such as "first", "second" and the like, may be used to distinguish one element from another among various elements, but not intended to limit the elements by the terms.

Throughout the specification, when a portion is referred to as "comprising" or "including" any element, it means that the portion may include other elements further, without excluding other elements, unless specifically stated otherwise.

Furthermore, the term "control unit" described in the specification refers to a unit that processes at least one function or operation, and may be implemented by hardware, software, or a combination of hardware and software.

In addition, throughout the specification, when a portion is referred to as being "connected" to another portion, it is not limited to the case that they are "directly connected", but it also includes the case where they are "indirectly connected" with another element being interposed between them.

Hereinafter, preferred embodiments of the present disclosure will be described in detail with reference to the accompanying drawings.

Figure 1:
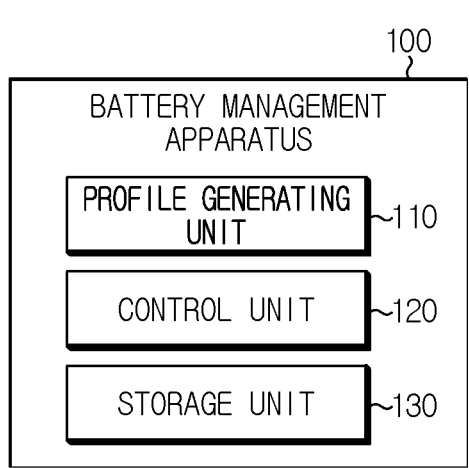
FIG. 1 is a diagram schematically showing a battery management apparatus according to an embodiment of the present disclosure.

FIG. 1 is a diagram schematically showing a battery management apparatus 100 according to an embodiment of the present disclosure.

Referring to FIG. 1, the battery management apparatus 100 may include a profile generating unit 110 and a control unit 120.

The profile generating unit 110 may be configured to obtain a battery profile PF_B representing a correspondence between voltage and SOC of a battery.

Here, the battery means one physically separable independent cell including a negative electrode terminal and a positive electrode terminal. For example, one pouch-type lithium polymer cell may be regarded as a battery. Also, the battery may refer to a battery module in which a plurality of cells are connected in series and/or in parallel. Hereinafter, for convenience of description, the battery will be described as meaning one independent cell.

Figure 2:
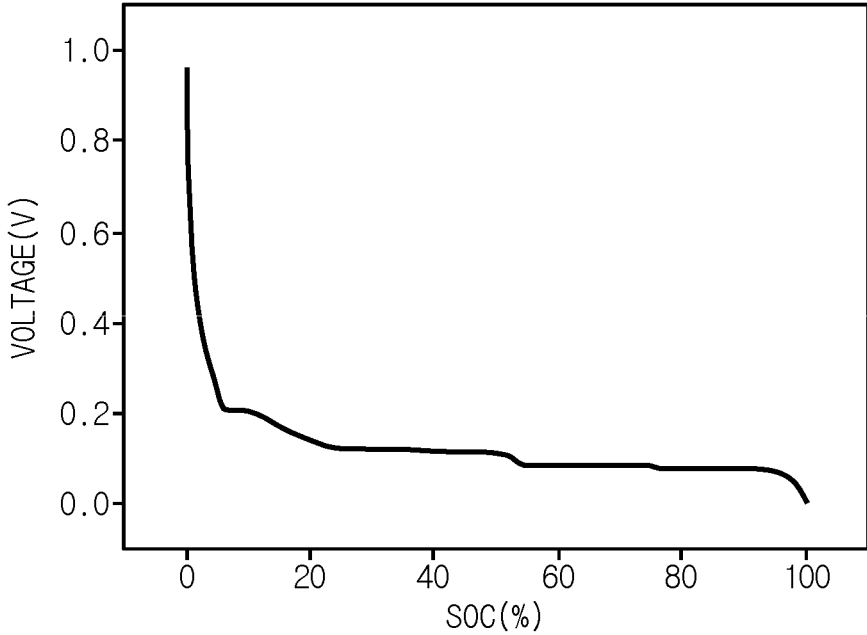
FIG. 2 is a diagram schematically showing a battery profile according to an embodiment of the present disclosure.

FIG. 2 is a diagram schematically showing a battery profile PF_B according to an embodiment of the present disclosure.

Specifically, FIG. 2 is a diagram illustrating an example of a battery profile PF_B that can be obtained by the profile generating unit 110. Referring to FIG. 2, the battery profile PF_B may be a profile representing the correspondence between voltage and SOC of a battery.

For example, the battery profile PF_B may be a profile for a negative electrode of the battery. That is, the battery profile PF_B may be a profile representing the correspondence between the voltage of the negative electrode of the battery and the SOC of the battery. The battery profile PF_B of FIG. 2 may be a profile obtained by charging the negative electrode of the battery with a constant current at a low rate (e.g., 0.05 C (C-rate)).

The profile generating unit 110 may be configured to generate a differential profile PF_D representing the correspondence between the SOC and a differential voltage for the SOC based on the obtained battery profile PF_B.

Figure 3:
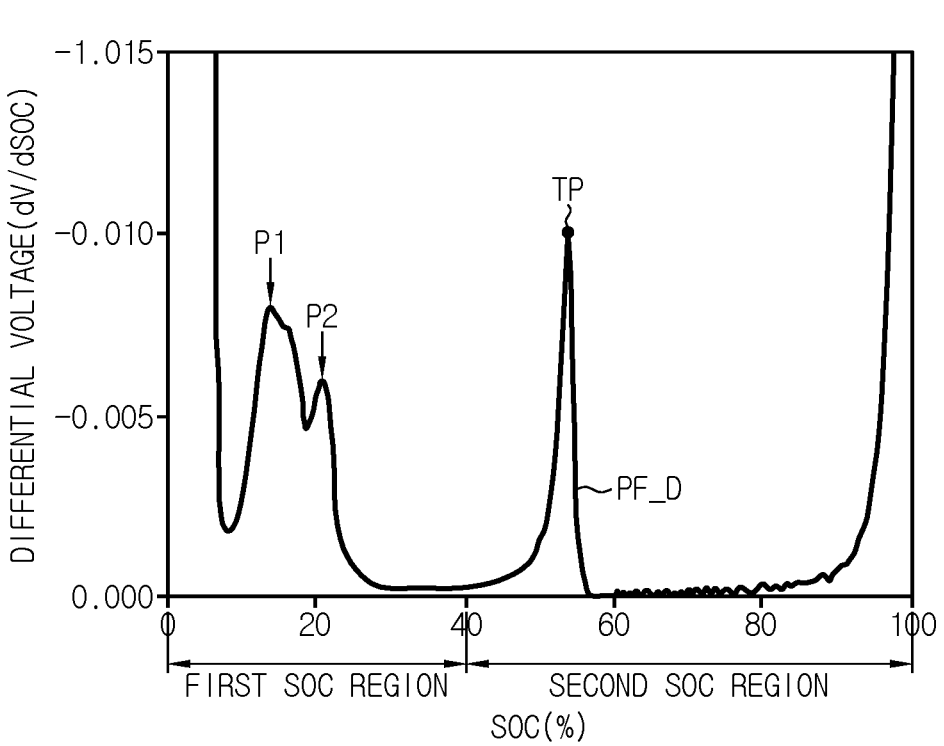
FIG. 3 is a diagram schematically showing a differential profile according to an embodiment of the present disclosure.

FIG. 3 is a diagram schematically showing a differential profile PF_D according to an embodiment of the present disclosure.

Specifically, the differential profile PF_D may be a profile representing the correspondence between the SOC of the battery and a differential voltage (dV/dSOC) obtained by differentiating the voltage of the battery by the SOC.

For example, referring to FIGS. 2 and 3, the profile generating unit 110 may obtain the battery profile PF_B of FIG. 2 and then generate the differential profile PF_D of FIG. 3 from the obtained profile.

The control unit 120 may be configured to receive the differential profile PF_D from the profile generating unit 110.

Specifically, the control unit 120 may be connected to communicate with the profile generating unit 110. After generating the differential profile PF_D, the profile generating unit 110 may transmit the generated differential profile PF_D to the control unit 120.

The control unit 120 may be configured to calculate the degree of association between the differential profile PF_D and a preset criterion profile.

Specifically, a plurality of criterion profiles may be provided. For example, the criterion profile may include a first criterion profile PF1 and a second criterion profile PF2 according to the type of the negative electrode of the battery.

Figure 4:
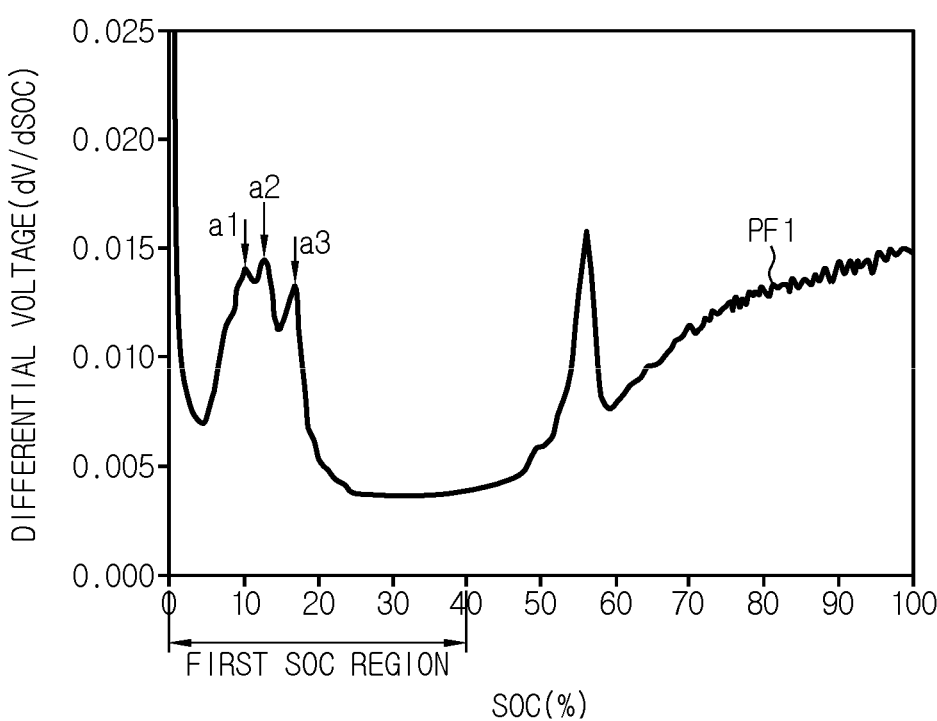
FIG. 4 is a diagram schematically showing a first criterion profile according to an embodiment of the present disclosure.

FIG. 4 is a diagram schematically showing a first criterion profile PF1 according to an embodiment of the present disclosure.

The first criterion profile PF1 may be a profile preset to represent the correspondence between the SOC and the differential voltage of a first reference cell including the natural graphite-based negative electrode. That is, the first criterion profile PF1 may be a differential profile PF_D for the first reference cell including the natural graphite-based negative electrode.

Figure 5:
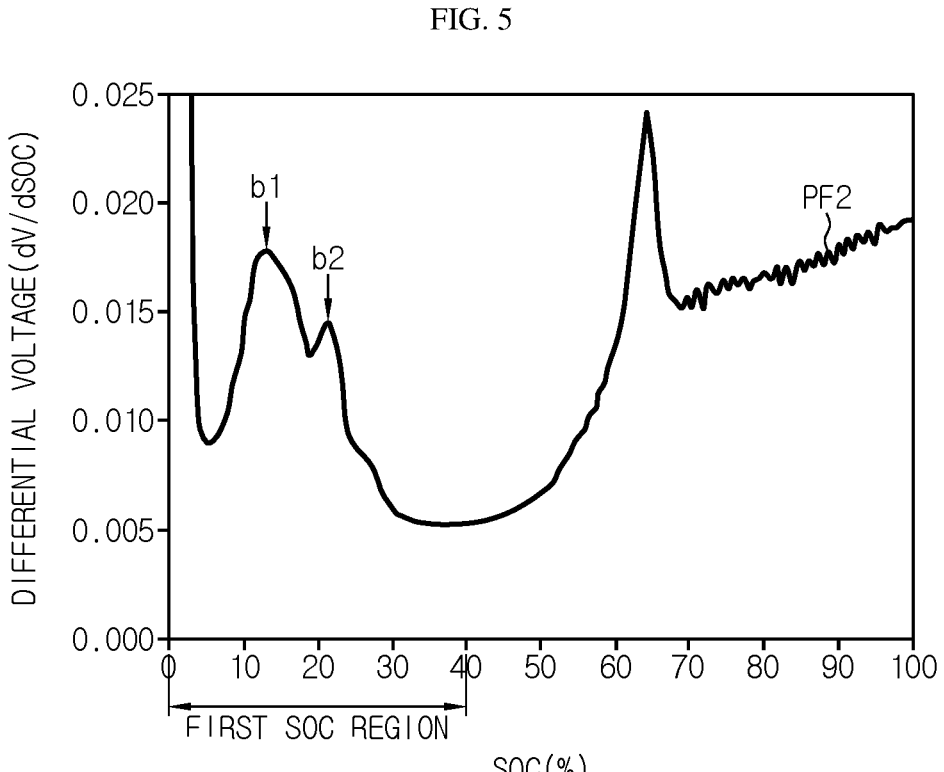
FIG. 5 is a diagram schematically showing a second criterion profile according to an embodiment of the present disclosure.

FIG. 5 is a diagram schematically showing a second criterion profile PF2 according to an embodiment of the present disclosure.

The second criterion profile PF2 may be a profile preset to represent the correspondence between the SOC and the differential voltage of a second reference cell including the artificial graphite-based negative electrode. That is, the second criterion profile PF2 may be a differential profile PF_D for the second reference cell including the artificial graphite-based negative electrode.

The control unit 120 may calculate the degree of association between the first criterion profile PF1 and the second criterion profile PF2, and the differential profile PF_D received from the profile generating unit 110, respectively. In addition, the control unit 120 may be configured to judge the type of the negative electrode of the battery based on the calculated degree of association.

That is, the control unit 120 may calculate the degree of association between the first criterion profile PF1 and the differential profile PF_D and between the second criterion profile PF2 and the differential profile PFD, and judge the type of the negative electrode of the battery as a natural graphite-based negative electrode or an artificial graphite-based negative electrode based on the calculated degree of association.

For example, for a battery whose negative electrode type is unknown, the battery management apparatus 100 may judge the type of the negative electrode of the battery as a natural graphite-based negative electrode or an artificial graphite-based negative electrode by using the battery profile PF_B of the battery and the differential profile PF_D.

Accordingly, the battery management apparatus 100 has an advantage of judging the type of the negative electrode of the battery even if there is no prior information about the battery.

Meanwhile, the control unit 120 provided in the battery management apparatus 100 may selectively include processors known in the art, application-specific integrated circuit (ASIC), other chipsets, logic circuits, registers, communication modems, data processing devices, and the like to execute various control logic performed in the present disclosure. Also, when the control logic is implemented in software, the control unit 120 may be implemented as a set of program modules. At this time, the program module may be stored in a memory and executed by the control unit 120. The memory may be located inside or out of the control unit 120 and may be connected to the control unit 120 by various well-known means.

In addition, the battery management apparatus 100 may further include a storage unit 130. The storage unit 130 may store data necessary for operation and function of each component of the battery management apparatus 100, data generated in the process of performing the operation or function, or the like. The storage unit 130 is not particularly limited in its kind as long as it is a known information storage means that can record, erase, update and read data. As an example, the information storage means may include random access memory (RAM), flash memory, read-only memory (ROM), electrically erasable programmable read-only memory (EEPROM), registers, and the like. In addition, the storage unit 130 may store program codes in which processes executable by the control unit 120 are defined.

The control unit 120 may be configured to calculate a first degree of association between the differential profile PF_D and a preset first criterion profile PF1. In addition, the control unit 120 may be configured to calculate a second degree of association between the differential profile PF_D and a preset second criterion profile PF2 to be different from the first criterion profile PF1.

For example, the first criterion profile PF1 and the second criterion profile PF2 may be stored in the storage unit 130.

Here, the first degree of association may represent a profile concordance rate between a first SOC region of the first criterion profile PF1 and the first SOC region of the differential profile PF_D. In addition, the second degree of association may represent a profile concordance rate between the first SOC region of the second criterion profile PF2 and the first SOC region of the differential profile PF_D.

The first SOC region may be an SOC region that does not include a target peak TP, which will be described later. For example, the first SOC region may be an SOC region of 0% or more and less than the SOC of the target peak TP. More specifically, the first SOC region may be an SOC region of 0% or more and less than 40%.

The control unit 120 may calculate the first degree of association based on the concordance rate between the first criterion profile PF1 and the differential profile PF_D in the first SOC region. For example, the control unit 120 may calculate the first degree of association by judging the concordance rate between the first criterion profile PF1 and the differential profile PF_D in consideration of the number of peaks and the SOC interval of the peaks included in the first SOC region of the first criterion profile PF1 and the first SOC region of the differential profile PF_D. Similarly, the control unit 120 may calculate the second degree of association based on the concordance rate between the second criterion profile PF2 and the differential profile PF_D in the first SOC region.

For example, in the embodiment of FIG. 3, a first peak P1 and a second peak P2 may be included in the first SOC region of the differential profile PF_D. Here, the peak may be a point at which the instantaneous change rate of the differential voltage with respect to the SOC is 0 and the instantaneous change rate of the differential voltage with respect to the SOC changes from positive to negative around the peak. That is, the peak may be a point having an upward convex form in the differential profile PF_D. In addition, in the embodiment of FIG. 4, the first SOC region of the first criterion profile PF1 may include a first peak a1, a second peak a2, and a third peak a3. In addition, in the embodiment of FIG. 5, a first peak b1 and a second peak b2 may be included in the first SOC region of the second criterion profile PF2. The control unit 120 may calculate the first degree of association between the differential profile PF_D and the first criterion profile PF1 for the first SOC region, and calculate the second degree of association between the differential profile PF_D and the second criterion profile PF2 for the first SOC region.

The control unit 120 may be configured to judge the type of the negative electrode of the battery by comparing the calculated first degree of association and the calculated second degree of association.

If the first degree of association is greater than or equal to the second degree of association, the control unit 120 may be configured to judge the negative electrode of the battery as a natural graphite-based negative electrode. Conversely, if the first degree of association is less than the second degree of association, the control unit 120 may be configured to judge the negative electrode of the battery as an artificial graphite-based negative electrode.

For example, referring to FIGS. 3 to 5, the number of peaks of the differential profile may be two, the number of peaks of the first criterion profile may be three, and the number of peaks of the second criterion profile may be two. In this case, based on the number of peaks, the first degree of association between the differential profile and the first criterion profile may be calculated to be lower than the second degree of association between the differential profile and the second criterion profile. Therefore, the control unit 120 may judge the negative electrode of the battery as an artificial graphite-based negative electrode. In this embodiment, it has been described that the degree of association is calculated in consideration of the number of peaks, but it should be noted that the degree of association between the first SOC region of the differential profile and the first SOC region of the criterion profile is calculated based on various factors such as the SOC of the peak, the differential voltage, and the distance between the peaks.

That is, since the first criterion profile PF1 is the differential profile PF_D for the first reference cell containing a natural graphite-based negative electrode and the second criterion profile PF2 is the differential profile PF_D for the second reference cell containing an artificial graphite-based negative electrode, if the first degree of association is greater than or equal to the second degree of association, the control unit 120 may judge the type of the negative electrode of the battery as a natural graphite-based negative electrode.

Here, the natural graphite-based negative electrode may be degraded faster when being charged or discharged at a higher C-rate, namely rapidly charged or discharged, compared to the artificial graphite-based negative electrode. Therefore, when the first degree of association and the second degree of association are calculated equally, the control unit 120 may judge the type of the negative electrode of the battery as a natural graphite-based negative electrode, thereby preventing unexpected degradation of the battery in advance. To prevent the battery from being degraded, a usage condition for the battery may be set according to the judged type of the negative electrode, as will be described later.

Meanwhile, the control unit 120 may first calculate the differential voltage of the target peak TP included in the second SOC region of the differential profile PF_D before judging the degree of association between the criterion profile and the differential profile PF_D, and then determine whether or not to judge the degree of association according to the calculated differential voltage.

That is, the control unit 120 may be configured to determine a target peak TP in the second SOC region of the differential profile PF_D. Here, the first SOC region and the second SOC region may be different from each other. Preferably, the first SOC region and the second SOC region may be different from each other not to overlap each other.

For example, the second SOC region may be an SOC region with an SOC of 40% or more and less than 100%. That is, in the SOC region of 50% or more, the control unit 120 may determine the target peak TP.

In the embodiment of FIG. 3, the control unit 120 may determine the target peak TP located at about SOC 56%.

Here, like the first peak and the second peak, the target peak TP may be a point at which the instantaneous change rate of the differential voltage with respect to SOC is 0 and the instantaneous change rate of the differential voltage with respect to SOC changes from positive to negative around the target peak TP.

The control unit 120 may be configured to compare the differential voltage of the determined target peak TP with a preset reference value.

Specifically, the reference value may be a value for dQ/dSOC. Therefore, the control unit 120 may compare the differential voltage of the target peak TP with the reference value.

For example, in the embodiment of FIG. 3, the differential voltage of the target peak TP may be −0.010 (dQ/dSOC), and the reference value may be −0.075 (dQ/dSOC).

The control unit 120 may be configured to determine whether or not to judge the type of the negative electrode of the battery according to the comparison result.

Specifically, when the differential voltage of the target peak TP is equal to or greater than the reference value, the control unit 120 may be configured to judge the type of the negative electrode of the battery based on the first criterion profile PF1, the second criterion profile PF2 and the differential profile PF_D.

That is, the control unit 120 may judge the type of the negative electrode of the battery only when the differential voltage of the target peak TP is greater than or equal to the reference value, and may not judge the type of the negative electrode of the battery when the differential voltage of the target peak TP is less than the reference value.

Here, when the differential voltage of the target peak TP is less than the reference value, the resistance of the negative electrode of the battery may be increased significantly, and in this case, it may not be possible to judge the type of the negative electrode of the battery as a natural graphite-based negative electrode or an artificial graphite-based negative electrode. That is, the reference value may be a differential voltage corresponding to the resistance of the negative electrode of the battery increased to the extent that the type of the negative electrode of the battery cannot be judged. Therefore, the control unit 120 may judge the type of the negative electrode of the battery only when the differential voltage is equal to or greater than the reference value.

As in the previous embodiment, in the embodiment of FIG. 3, it is assumed that the differential voltage of the target peak TP is −0.010 (dQ/dSOC), and the reference value is −0.075 (dQ/dSOC). Since the differential voltage of the target peak TP is equal to or greater than the reference value, the control unit 120 may judge the type of the negative electrode of the corresponding battery by comparing the differential profile PF_D of the corresponding battery with the first criterion profile PF1 and the second criterion profile PF2, respectively.

The control unit 120 may be configured to set a usage condition for the battery based on whether the type of the negative electrode of the battery is judged and the judged type of the negative electrode of the battery.

Here, the usage condition is an optimal condition in which the battery can be used, and may be a condition set for a charging and discharging C-rate of the battery and/or an available SOC region.

The control unit 120 may be configured to set the usage condition for the battery such that the battery is charged and discharged at less than a predetermined C-rate, when the negative electrode of the battery is judged as a natural graphite-based negative electrode. For example, the predetermined C-rate may be set to 1 C or more.

When the battery containing a natural graphite-based negative electrode is charged or discharged at a high C-rate, it may be degraded faster than a battery containing an artificial graphite-based negative electrode. Therefore, when the negative electrode of the battery is judged as a natural graphite-based negative electrode, the control unit 120 may set the charging and discharging C-rate for the battery to be less than the predetermined C-rate, so that the corresponding battery may be degraded slowly in a situation where the battery is actually used.

The control unit 120 may be configured to set the usage condition for the battery so that the battery is charged and discharged at the predetermined C-rate or more, when the negative electrode of the battery is judged as an artificial graphite-based negative electrode.

The battery containing an artificial graphite-based negative electrode may be degraded more slowly than a battery containing a natural graphite-based negative electrode, even if it is charged or discharged at a high C-rate. Therefore, when the negative electrode of the battery is judged as an artificial graphite-based negative electrode, the control unit 120 may set the charging and discharging C-rate for the battery to be the predetermined C-rate or more, so that the charging and discharging efficiency of the battery is improved in a situation where the corresponding battery is actually used.

If the type of the negative electrode of the battery is not judged, the control unit 120 may be configured to reduce the available SOC region for the battery and set the usage condition for the battery so that the battery is charged and discharged at less than the predetermined C-rate.

As described above, when the differential voltage of the target peak TP is less than the reference value, the control unit 120 may not judge the type of the negative electrode of the battery. In this case, since the negative electrode of the battery may be a natural graphite-based negative electrode, the control unit 120 may set the charging and discharging C-rate for the corresponding battery to be less than a predetermined C-rate, thereby preventing the battery from being degraded due to rapid charging and discharging. In addition, the control unit 120 may prevent the battery from being degraded due to full charge (or overcharge) and full discharge (or overdischarge) by reducing the available SOC region of the battery in which the type of the negative electrode is not judged.

That is, the battery management apparatus 100 according to an embodiment of the present disclosure may not only judge the type of the negative electrode of the battery, but also set the usage condition for the battery to correspond to the judgment result, and thus has an advantage of preventing the battery from being rapidly degraded in an actual use environment.

Meanwhile, for example, the usage condition set for the battery may be stored in the control unit 120 or the storage unit 130. As another example, the usage condition set for the battery may be transmitted to an external server by the control unit 120, and the usage condition for the battery may be stored in the external server.

Figure 6:
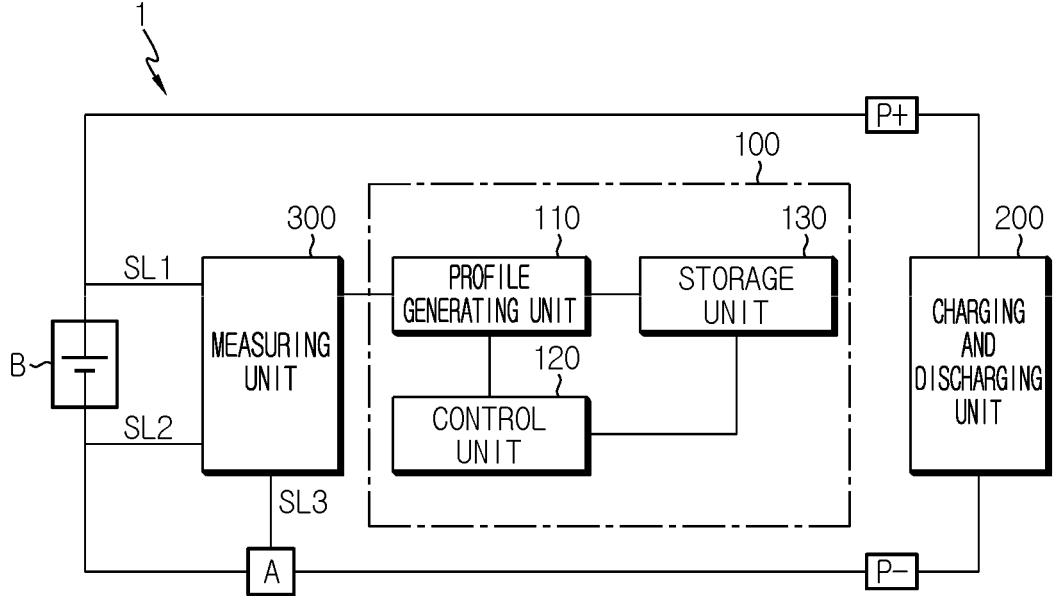
FIG. 6 is a diagram schematically showing a battery inspection device according to another embodiment of the present disclosure.

FIG. 6 is a diagram schematically showing a battery inspection device according to another embodiment of the present disclosure.

Referring to FIG. 6, the battery inspection device may include a battery management apparatus 100, a charging and discharging unit 200, and a measuring unit 300.

The charging and discharging unit 200 may discharge the battery B to SOC 0% and then charge from 0% to 100% SOC. For example, the charging and discharging unit 200 may discharge and charge the battery B at a charging and discharging rate of 0.05 C. Preferably, the type of the negative electrode of the battery B may be unknown.

The measuring unit 300 may measure the voltage and current of the battery B while the battery B is being charged by the charging and discharging unit 200, and may estimate the SOC of the battery B.

For example, the measuring unit 300 may be connected to the battery B through a first sensing line SL1 and a second sensing line SL2. In addition, the measuring unit 300 may measure the voltage of the battery B through the first sensing line SL1 and the second sensing line SL2. In addition, the measuring unit 300 may be connected to a current measuring unit A through a third sensing line SL3 to measure the current of the battery B.

For example, the measuring unit 300 may generate a battery profile PF_B representing the correspondence between the measured voltage of the battery B and the estimated SOC of the battery B, and transmit the generated battery profile PF_B to the battery management apparatus 100. The battery management apparatus 100 may generate a differential profile PF_D for the battery B according to the battery profile PF_B received from the measuring unit 300, and judge the type of the negative electrode of the battery B based on the generated differential profile PF_D, a preset first criterion profile PF1 and a preset second criterion profile PF2. Also, the battery management apparatus 100 may set a usage condition for the battery B based on whether the type of the negative electrode of the battery B is judged and the judged type of the negative electrode of the battery B.

Therefore, the battery inspection device has an advantage of not only judging the type of the negative electrode of the battery B, but also setting an optimal usage condition for the battery B.

The battery management apparatus 100 according to the present disclosure may be applied to a BMS (Battery Management System). That is, the BMS according to the present disclosure may include the battery management apparatus 100 described above. In this configuration, at least some of the components of the battery management apparatus 100 may be implemented by supplementing or adding functions of the configuration included in the conventional BMS. For example, the profile generating unit 110, the control unit 120 and the storage unit 130 may be implemented as components of the BMS.

In addition, the battery management apparatus 100 according to the present disclosure may be provided in a battery pack. That is, the battery pack according to the present disclosure may include the above-described battery management apparatus 100 and one or more batteries B. In addition, the battery pack may further include electrical equipment (relays, fuses, etc.) and a case.

Preferably, the battery management apparatus 100 may set the usage condition for the battery B included in the battery pack. That is, the charging and discharging C-rate of the battery B included in the battery management apparatus 100 may be controlled according to the set usage condition. Accordingly, since charging and discharging of battery B may be controlled to correspond to the set usage condition, rapid degradation of the battery B may be prevented.

For example, the battery management apparatus 100 may judge the type of the negative electrode for a battery B, which is to be reused, and set the usage condition therefor.

If the battery B, which is to be reused, is applied to an energy storage system (ESS), as its charging and discharging are controlled according to the set usage condition, the lifespan of the battery B may be increased.

Figure 7:
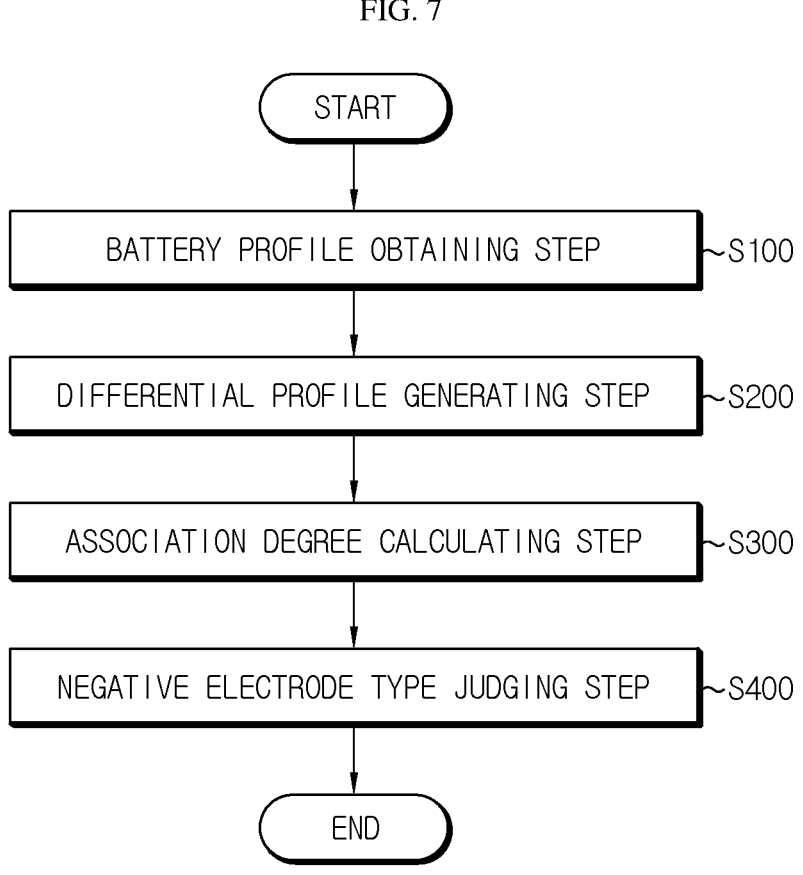
FIG. 7 is a diagram schematically showing a battery management method according to still another embodiment of the present disclosure.

FIG. 7 is a diagram schematically showing a battery management method according to still another embodiment of the present disclosure.

Each step of the battery management method may be performed by the battery management apparatus 100. Hereinafter, for convenience of description, contents overlapping with the previously described contents will be omitted or briefly described.

Referring to FIG. 7, the battery management method may include a battery profile obtaining step (S100), a differential profile generating step (S200), an association degree calculating step (S300) and a negative electrode type judging step (S400).

The battery profile obtaining step (S100) is a step of obtaining a battery profile PF_B representing the correspondence between voltage and SOC of the battery B, and may be performed by the profile generating unit 110.

For example, the profile generating unit 110 may obtain the battery profile PF_B of FIG. 2.

The differential profile generating step (S200) is a step of generating a differential profile PF_D representing the correspondence between the SOC and a differential voltage for the SOC based on the battery profile PF_B obtained in the battery profile obtaining step (S100), and may be performed by the profile generating unit 110.

For example, the profile generating unit 110 may generate the differential profile PF_D of FIG. 3 based on the battery profile PF_B of FIG. 2.

The association degree calculating step (S300) is a step of calculating the degree of association between the differential profile PF_D and a preset criterion profile, and may be performed by the control unit 120.

For example, the criterion profile may include a first criterion profile PF1 and a second criterion profile PF2. In this case, the control unit 120 may calculate a first degree of association between the first criterion profile PF1 and the differential profile PF_D, and calculate a second degree of association between the second criterion profile PF2 and the differential profile PF_D.

The negative electrode type judging step (S400) is a step of judging the type of the negative electrode of the battery B based on the degree of association calculated in the association degree calculating step (S300), and may be performed by the control unit 120.

For example, the control unit 120 may judge the type of the negative electrode of the battery B as a natural graphite-based negative electrode or an artificial graphite-based negative electrode based on the calculated degree of association.

In addition, the battery management method may further include a usage condition setting step (not shown) for set a usage condition for the battery B, based on the type of the negative electrode of the battery B judged in the negative electrode type judging step (S400). Preferably, the usage condition setting step may be performed by the control unit 120.

Figure 8:
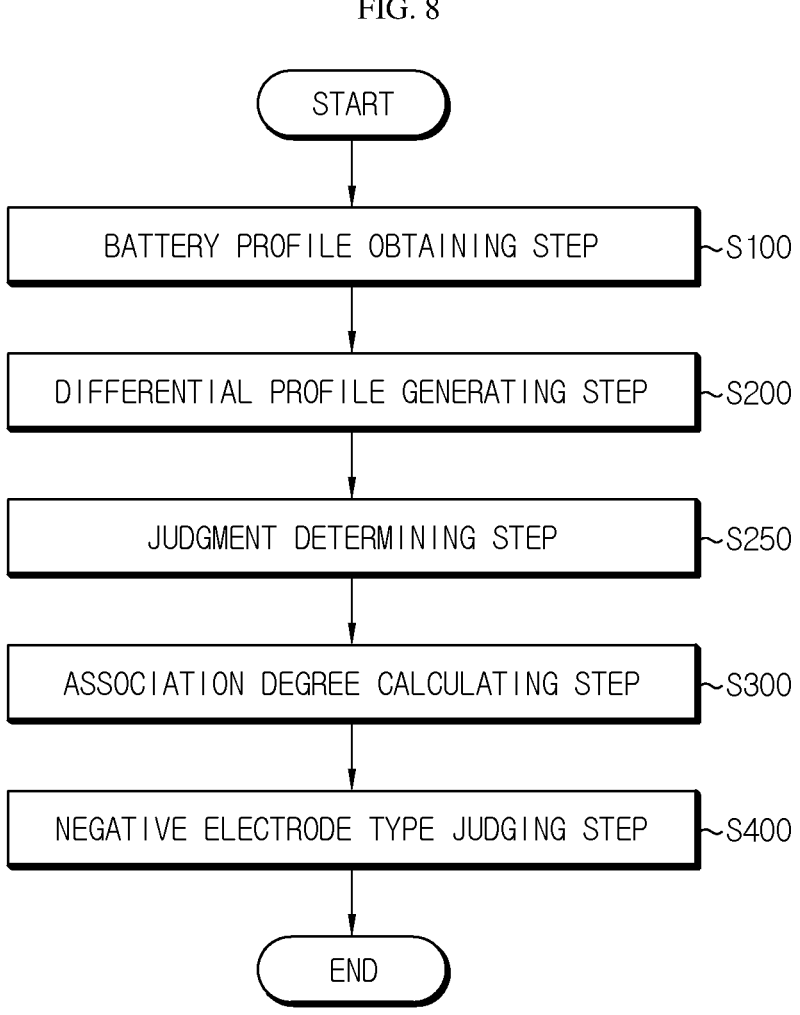
FIG. 8 is a diagram schematically showing a battery management method according to still another embodiment of the present disclosure.

FIG. 8 is a diagram schematically showing a battery management method according to still another embodiment of the present disclosure.

Referring to FIG. 8, the battery management method may further include a judgment determining step (S250).

The judgment determining step (S250) may be performed by the control unit 120 after the differential profile generating step (S200) and before the association degree calculating step (S300).

Specifically, the judgment determining step (S250) may be a step of determining a target peak TP in the second SOC region of the differential profile PF_D, comparing the determined differential voltage of the target peak TP with a preset reference value, and determining whether or not to judge the type of the negative electrode of the battery B according to the comparison result.

For example, the control unit 120 may determine the target peak TP in the second SOC region of the differential profile PF_D before calculating the degree of association between the criterion profile and the differential profile PF_D. In the embodiment of FIG. 3, the control unit 120 may determine the target peak TP in the second SOC region (40% to 100% SOC region) of the differential profile PF_D. In addition, the control unit 120 may determine whether or not to judge the type of the negative electrode of the battery B based on the comparison result between the differential voltage of the target peak TP and the reference value.

The association degree calculating step (S300) may calculate the degree of association only when it is determined in the judgment determining step (S250) to judge the type of the negative electrode of the battery B.

For example, if the differential voltage of the target peak TP is equal to or greater than the reference value, the control unit 120 may determine to judge the type of the negative electrode of the battery B, and may perform the association degree calculating step (S300).

Conversely, if the differential voltage of the target peak TP is less than the reference value, the control unit 120 may determine not to judge the type of the negative electrode of the battery B, and may not perform the association degree calculating step (S300).

The embodiments of the present disclosure described above may not be implemented only through an apparatus and a method, but may be implemented through a program that realizes a function corresponding to the configuration of the embodiments of the present disclosure or a recording medium on which the program is recorded. The program or recording medium may be easily implemented by those skilled in the art from the above description of the embodiments.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

Additionally, many substitutions, modifications and changes may be made to the present disclosure described hereinabove by those skilled in the art without departing from the technical aspects of the present disclosure, and the present disclosure is not limited to the above-described embodiments and the accompanying drawings, and each embodiment may be selectively combined in part or in whole to allow various modifications.

REFERENCE SIGNS

1: battery inspection device
100: battery management apparatus
110: profile generating unit
120: control unit 130: storage unit
200: charging and discharging unit
300: measuring unit
B: battery

What is claimed is:

1. A battery management apparatus, comprising:

a controller; and memory having instructions that, when executed, are configured to cause the controller to:

receive a differential profile representing a correspondence between a state of charge (SOC) of a battery and a differential voltage of the SOC;

calculate a degree of association between the differential profile and one or more preset profiles; and determine a type of a negative electrode of the battery based on the calculated degree of association, wherein the one or more preset profiles includes a first preset profile and a second preset profile different from the first preset profile, and wherein the instructions are configured to cause the controller to:

calculate a first degree of association between the differential profile and the first preset profile;

calculate a second degree of association between the differential profile and the second preset profile;

compare the first degree of association to the second degree of association; and determine the type of the negative electrode of the battery based on the comparison.

2. The battery management apparatus according to claim 1, wherein the instructions are configured to cause the controller to:

determine that the negative electrode of the battery is a natural graphite-based negative electrode in response to the first degree of association being equal to or greater than the second degree of association; and determine that the negative electrode of the battery is an artificial graphite-based negative electrode in response to the first degree of association being less than the second degree of association.

3. The battery management apparatus according to claim 2, wherein the first preset profile represents a correspondence between the SOC and the differential voltage of a first reference cell including the natural graphite-based negative electrode, and wherein the second preset profile represents a correspondence between the SOC and the differential voltage of a second reference cell including the artificial graphite-based negative electrode.

4. The battery management apparatus according to claim 1, wherein the first degree of association represents a profile concordance rate between a first SOC region of the first preset profile and the first SOC region of the differential profile, and wherein the second degree of association represents a profile concordance rate between the first SOC region of the second preset profile and the first SOC region of the differential profile.

5. The battery management apparatus according to claim 1, wherein the instructions are configured to cause the controller to:

determine a target peak in a second SOC region of the differential profile;

compare a differential voltage of the determined target peak with a preset reference value; and determine whether to determine the type of the negative electrode of the battery based on the comparison between the differential voltage of the determined target peak and the preset reference value.

6. The battery management apparatus according to claim 5, wherein the instructions are configured to cause the controller to determine the type of the negative electrode of the battery based on the first preset profile, the second preset profile and the differential profile in response to the differential voltage of the target peak being equal to or greater than the reference value.

7. The battery management apparatus according to claim 5, wherein the instructions are configured to cause the controller to set a usage condition for the battery, based on the determined type of the negative electrode of the battery.

8. The battery management apparatus according to claim 7, wherein the instructions are configured to cause the controller to:

set the usage condition for the battery so that the battery is charged and discharged at less than a predetermined current rate (C-rate) in response to the negative electrode of the battery being determined as a natural graphite-based negative electrode;

set the usage condition for the battery so that the battery is charged and discharged at the predetermined C-rate or above in response to the negative electrode of the battery being determined as an artificial graphite-based negative electrode; and reduce an available SOC region for the battery and set the usage condition for the battery so that the battery is charged and discharged at less than the predetermined C-rate in response to the type of the negative electrode of the battery being undetermined.

9. A battery inspection device, comprising the battery management apparatus according to claim 1.

10. A battery management method, comprising:

receiving, by a controller, a differential profile representing a correspondence between a state of charge (SOC) of a battery and a differential voltage of the SOC;

calculating, by the controller, a degree of association between the differential profile and one or more preset profiles; and determine, by the controller, a type of a negative electrode of the battery based on the degree of association, wherein the one or more preset profiles includes a first preset profile and a second preset profile different from the first preset profile, and wherein the method further includes:

calculating, by the controller, a first degree of association between the differential profile and the first preset profile;

calculating, by the controller, a second degree of association between the differential profile and the second preset profile;

comparing, by the controller, the first degree of association to the second degree of association; and determining, by the controller, the type of the negative electrode of the battery based on the comparison.

11. The battery management method according to claim 10, further comprising:

determining, by the controller, a target peak in an SOC region of the differential profile; and comparing, by the controller, a differential voltage of the determined target peak with a preset reference value, wherein calculating the degree of association and determining the type of the negative electrode of the battery are performed in response to the differential voltage of the target peak being equal to or greater than the reference value.

12. A battery pack, comprising:

the battery; and the battery management apparatus according to claim 1.

* * * * *